United States Patent [19]

Pausch

[11] Patent Number: 5,581,187
[45] Date of Patent: Dec. 3, 1996

[54] ACTIVELY SHIELDED PLANAR GRADIENT COIL FOR POLE PLATE MAGNETS OF A MAGNETIC RESONANCE IMAGING APPARATUS

[75] Inventor: Guenther Pausch, Effeltrich, Germany

[73] Assignee: Siemens Aktiengesellschaft, Munich, Germany

[21] Appl. No.: 490,673

[22] Filed: Jun. 15, 1995

[30] Foreign Application Priority Data

Jun. 29, 1994 [DE] Germany .................. 44 22 781.7

[51] Int. Cl.$^6$ .................................................. G01R 33/20
[52] U.S. Cl. .......................................................... 324/318
[58] Field of Search ................................. 324/318, 322, 324/300, 314, 320; 335/299, 301

[56] References Cited

U.S. PATENT DOCUMENTS

| | | | |
|---|---|---|---|
| 4,728,895 | 3/1988 | Briguet et al. | 324/318 |
| 4,791,370 | 12/1988 | MacKinnon | 324/318 |
| 4,794,338 | 12/1988 | Roemer et al. | 324/318 |
| 4,926,125 | 5/1990 | Roemer | 324/318 |
| 5,036,282 | 7/1991 | Morich et al. | 324/318 |
| 5,166,619 | 11/1992 | Ries | 324/318 |
| 5,309,107 | 5/1994 | Pausch | 324/318 |
| 5,337,001 | 8/1994 | McDougall et al. | 324/318 |
| 5,349,318 | 9/1994 | Inoue | 324/318 |
| 5,349,744 | 9/1994 | Takahashi | 324/318 |
| 5,406,205 | 4/1995 | Muller | 324/318 |

*Primary Examiner*—Sandra L. O'Shea
*Assistant Examiner*—Raymond Y. Mah
*Attorney, Agent, or Firm*—Hill, Steadman & Simpson

[57] ABSTRACT

Each pole plate of a pole plate magnet of a magnetic resonance imaging apparatus has a sub-coil of the gradient coil allocated to it. Each sub-coil is composed of a primary and a secondary coil, respectively lying on one of two overlapping surfaces of a frustrum. The winding curve of each sub-coil changes multiply over a surface of the frustrum between the surfaces. The gradient coil can thus be optimized such that the required, maximum current densities become significantly lower compared to conventional, actively shielded arrangements.

7 Claims, 7 Drawing Sheets

ACTIVELY SHIELDED PLANAR GRADIENT COIL FOR POLE PLATE MAGNETS OF A MAGNETIC RESONANCE IMAGING APPARATUS

BACKGROUND OF THE INVENTION

1. Field of the Invention

The present invention is directed to an actively shielded planar gradient coil for pole plate magnets of the type employable in a magnetic resonance imaging apparatus.

2. Description of the Prior Art

Pole plate designs are usually utilized for nuclear magnetic resonance tomography systems in the low-field range that work with permanent magnets or normally conductive electromagnets. They are advantageous with respect to patient comfort and accessibility due to their open design.

U.S. Pat. No. 5,166,619, for example, discloses such a nuclear magnetic resonance tomography apparatus and is schematically shown in FIG. 1 herein for explaining a problem associated with these types of arrangements. In this embodiment of a nuclear magnetic resonance tomography apparatus having a basic field magnet 1 in the form of a C-magnet, the static, basic magnetic field proceeds parallel to the z-axis of a rectangular coordinate system having the axes x, y, z. This nuclear magnetic resonance tomography apparatus is provided for examination of a test subject, particularly a human body, whose physical axis extends in the direction of the x-axis of the coordinate system and whose body region to be examined is located in the imaging volume 2 between circular pole plates 3 and 4 of the basic field magnet 1. The basic magnetic field $B_o$ that proceeds in the direction of the z-axis of the coordinate system is generated by electrical coils 5 and 6. The origin of coordinates of the coordinate system, which is shown outside the imaging volume 2 only for clarity, should lie in the middle between the pole plates 3 and 4, so that the z-axis coincides with the rotational axis of the pole plates 3 and 4. The spacing H between the pole plates 3 and 4 can, for example, amount to 45 cm. The basic magnetic field $B_o$ is closed via a magnetic yoke 9.

Respective sub-coils 11 and 12 of the gradient coils, implemented as flat coils, are embedded in recesses of the pole plates 3 and 4. A separate pair of sub-coils is provided for each gradient direction x, y, z.

The interactions of the pulsed gradient coils with the various structures of the pole plate magnets are disproportionately more complicated than in the case of systems having a Helmholtz coil arrangement for the magnets. In addition to classic eddy currents, diffusion events occur and hysteresis effects in the pole shoes lead to transient noise fields that generally behave in a non-linear fashion and, moreover are dependent on the prior magnetic history of the system. These noise fields have a negative effect on the image quality. This is especially true for modern, fast imaging methods (for example, echo planar imaging) since gradients having a high amplitude are switched very quickly in such methods.

There are a number of proposals as to how these disturbing effects can be diminished. In general, the approach has been to try to device a specifically fashioned pole plate surface, to suppress the eddy currents as well as to conduct the stray flux of the gradient coil in a defined slice, having known behavior and comprised of a material with suitable permeability. For example, it is known to implement those parts of the pole plates facing toward the gradient coils as a wound iron tape having intervening insulating layers. Such measures, however, result in an adequate image quality only for comparatively simple sequence types (for example, spin echo sequence). Similar to the case of magnetic resonance systems with a cylindrical examination space, the disturbing interactions can be noticeably reduced by employing actively shielded gradient coils i.e., every gradient coil, or every sub-coil, is composed of a primary coil and a secondary coil lying parallel thereto. The primary coil and the secondary coil respectively have oppositely directed currents and are dimensioned such that the magnetic field of the gradient coil in the direction of the pole shoes is substantially fully compensated. The simple proposal of two coils arranged parallel to one another with opposite current flow, however, is technically impractical, as shall be set forth below with reference to FIGS. 2–5.

FIG. 2 shows the basic structure of a simple, actively shielded, transversal gradient coil (in this case, for the gradient in x-direction) in, perspective; the sectional view of FIG. 3 shows the corresponding course of the field lines. The gradient coil for the x-direction is composed of upper and lower primary coils 11a and 12a and lower and upper secondary coils 11b and 12b. The individual sub-coils are respectively constructed in conformity with U.S. Pat. No. 5,166,619.

When edge fringing is left out of consideration given this coil configuration and a limitation is initially made to the current density at x=0, then the following estimate for the flux $\Phi$ can be undertaken:

$$\Phi \sim (r \cdot z_p)/2\mu_o \cdot G_x = H_x \cdot \Delta_z$$

wherein r is the radius of the overall coil arrangement, $Z_p$ is the z primary coil, $G_x$ is the gradient in x-direction, $H_x$ is the field strength in x-direction and $\Delta z$ is the spacing between the primary and secondary coils.

The current density $J_{ys}$ given x=0 at the location $z_s$ of the secondary coils 11b and 12b is calculated therefrom as:

$$J_{ys} = -H_x = -z_p/\mu_o \cdot G_x \cdot (r/2\Delta z)$$

If the current density of an unshielded coil given x=0 is referenced $J_0 = z_p/\mu_0 \cdot G_x$, then $$J_{yp} = J_{ys} + J_o$$

is valid for the required current density at the location $z_p$ of the primary coils 11a and 12a. The following estimates for the relationship of the required current densities derive therefrom:

$$J_{ys}/J_0 = -(r/2\Delta z)$$

$$J_{yp}/J_0 = 1 + (r/2\Delta z)$$

When typical numerical values are introduced for pole plate magnets (for example, R=0.48 m, $\Delta z$=0.03 m), then $J_{ys}/J_0 = -8$ and $J_{yp}/J_0 = 9$ are obtained. In the aforementioned example, this means that approximately seven times the current density of an unshielded coil is required overall for an actively shielded gradient coil.

FIG. 4 shows a coil arrangement (unshielded) corresponding to the initially cited U.S. Pat. No. 5,166,619, whereby only half of a symmetrically constructed sub-coil is shown. One can clearly see that the turn density at the outer edge of the coil is to a multiple of the turn density in the inside of the coil, for example given x=0. It may be seen therefrom that a noticeable increase of the current density at a given current seems possible by increasing the turn density in the inner region of the coil. An increase in the turn density at the outer edge of the coil can only be achieved at the expense of (i.e., by decreasing) the conductor cross section.

The current density for an actively shielded gradient coil that is higher by a factor of 9 in the aforementioned example would, at a given current, require a number of turns higher by a factor of 9 or would assume a current higher by a factor of 9 with a given number of turns. The dissipative losses of the gradient coil increase noticeably both in the case of operation of the gradient coil with higher current as well as in the case of a higher number of turns with a necessarily smaller conductor cross section. In particular, extremely high losses locally occur in the outer region of the gradient coil.

FIG. 5 shows a coil design for an actively shielded gradient coil, namely for the primary coil 11a and the secondary coil 11b of one half of a symmetrically constructed sub-coil. Differing from the coil design of FIG. 2, FIG. 5 shows what is referred to as a "fingerprint" arrangement as is obtained, for example, in a method disclosed in U.S. Pat. No. 5,309,107. By comparison to the ill that is three times higher was selected, so that the number of turns is reduced by one-third with a given current density. One can see approximately 17 conductor elements in the central structure of the primary coil, these being mainly oriented in the z-direction. By contrast, the classic unshielded structure in FIG. 4 is composed of six such elements. When the coil current that is three times larger, is also taken into consideration and the current densities are correspondingly scaled, then the following relationship of the equivalent current densities of shielded and unshielded coil are obtained:

$$\frac{(17 \cdot 3)}{6} \sim 5.5$$

The fact that a ratio of only 5.5 arises by comparison to the factor 9 in the earlier estimate is attributed to the advantages of an energy-minimizing design.

One can see a high density of the winding curve in the edge region of the coils in FIG. 5, this arising due to the high current density. High thermal loads occur in these edge regions. The technically required outlay for cooling such an arrangement has hitherto prevented practical solutions for actively shielded, transversal gradient coils in pole plate magnets.

SUMMARY OF THE INVENTION

It is an object of the present invention to provide an actively shielded, transversal gradient coil for pole plate magnets wherein the maximum current densities can be noticeably reduced.

The above object is achieved in accordance with the principles of the present invention in a magnetic resonance tomography apparatus having two pole plates disposed opposite each other on opposite sides of an examination volume therebetween, each pole plate having a gradient coil with a sub-coil and each sub-coil, in turn, being composed of a primary coil and a secondary coil, the primary coil and the secondary coil of each sub-coil being disposed on opposed surfaces of a frustrum, and the primary coil and the secondary coil of each sub-coil respectively having current flowing therein so that the respective magnetic fields generated by the primary and secondary coils toward the pole plate is substantially cancelled, and wherein the winding of each sub-coil changes multiply over a surface of the frustrum joining the opposed surfaces of the frustrum.

The aforementioned frustrum is an imaginary surface on which the primary and secondary coils are disposed, and the term is used herein in the generic sense of meaning a section of any solid cut by two parallel planes. The parallel planes constitute the aforementioned opposed surfaces, and the portion of the surface extending between the parallel planes constitutes the surface over which the windings multiply change.

DESCRIPTION OF THE DRAWINGS

FIG. 5 illustrates a known gradient coil shielding technique, for explaining the problem to which the invention is directed, as set forth above.

DESCRIPTION OF THE PREFERRED EMBODIMENTS

Figure 1:
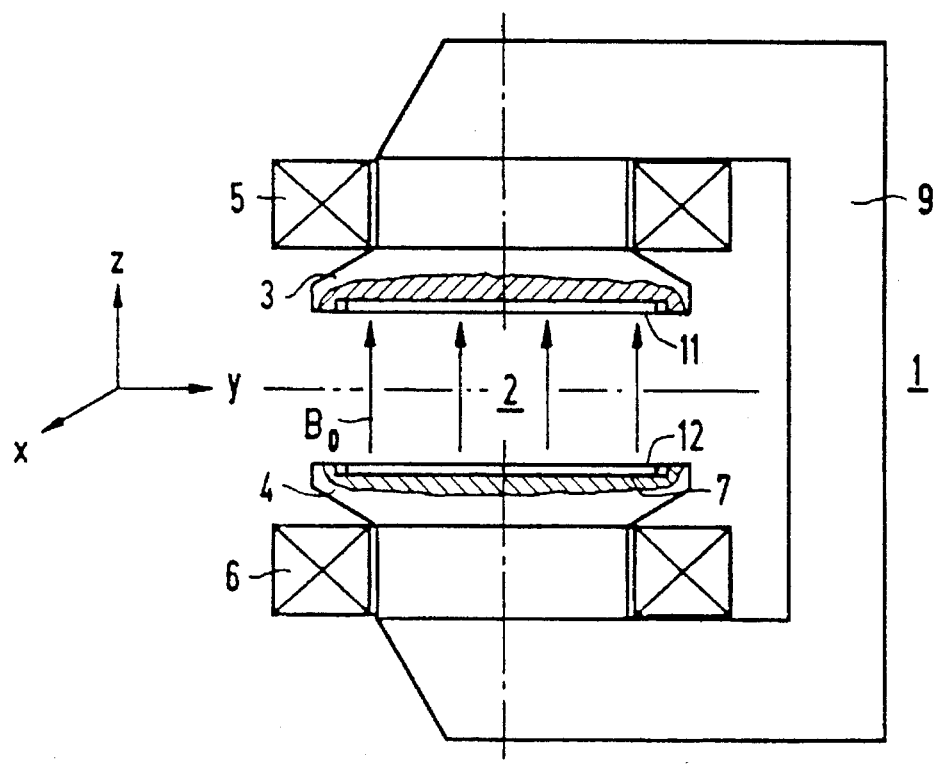
FIGS. 1–5 illustrate various features of a known magnetic resonance tomography apparatus having an unshielded gradient coil.
Figure 2:
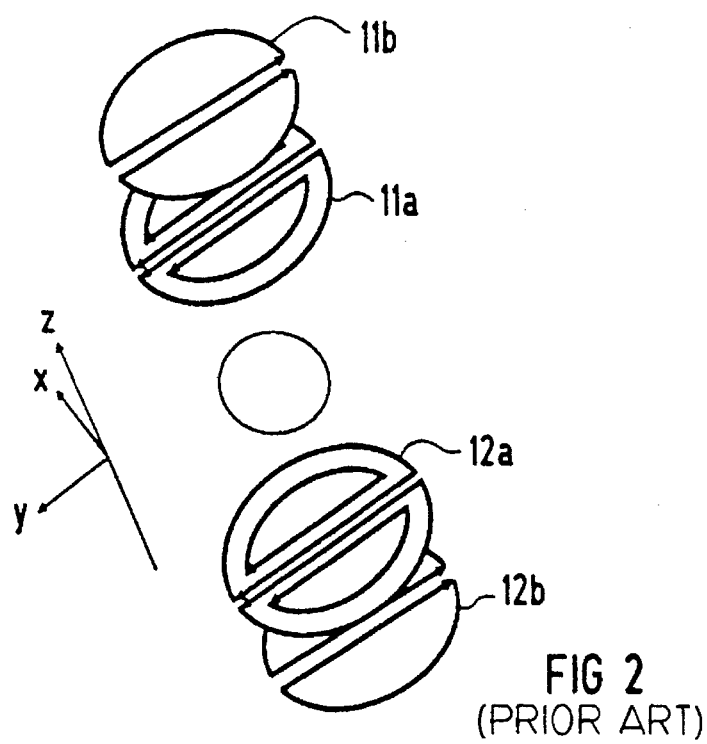
Figure 3:
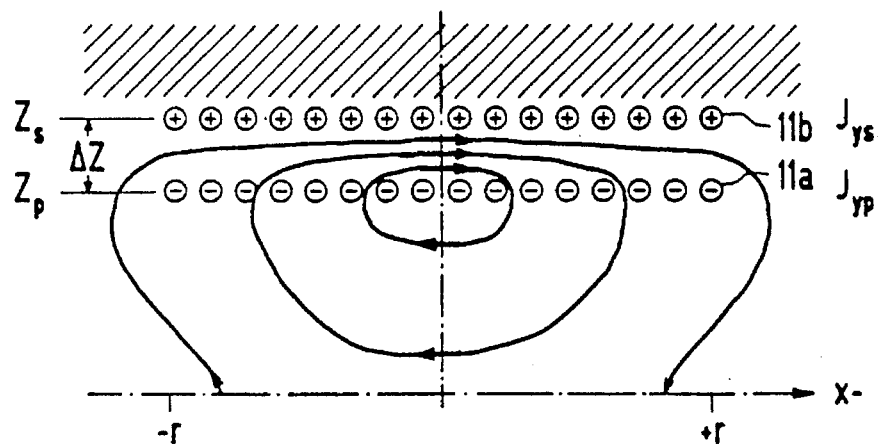
Figure 4:
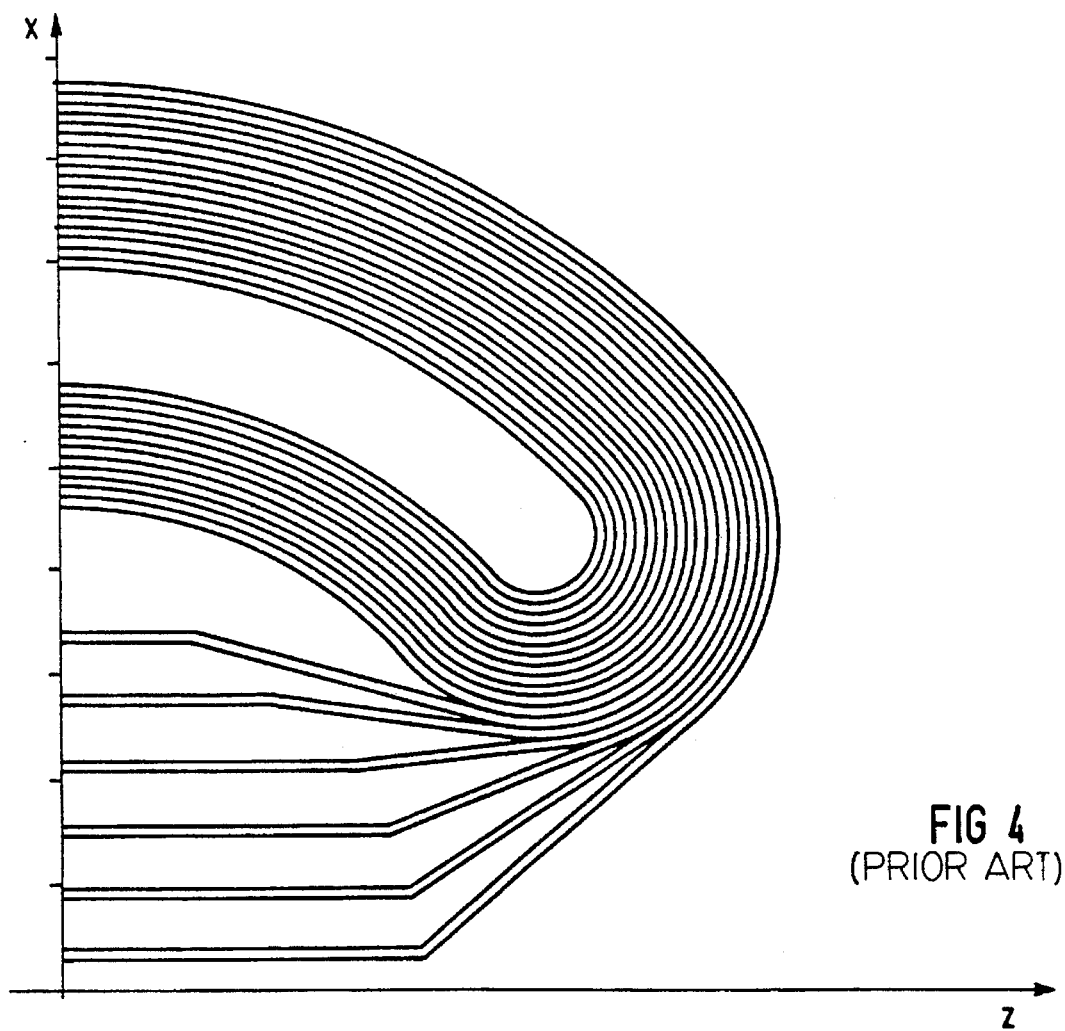
Figure 5:
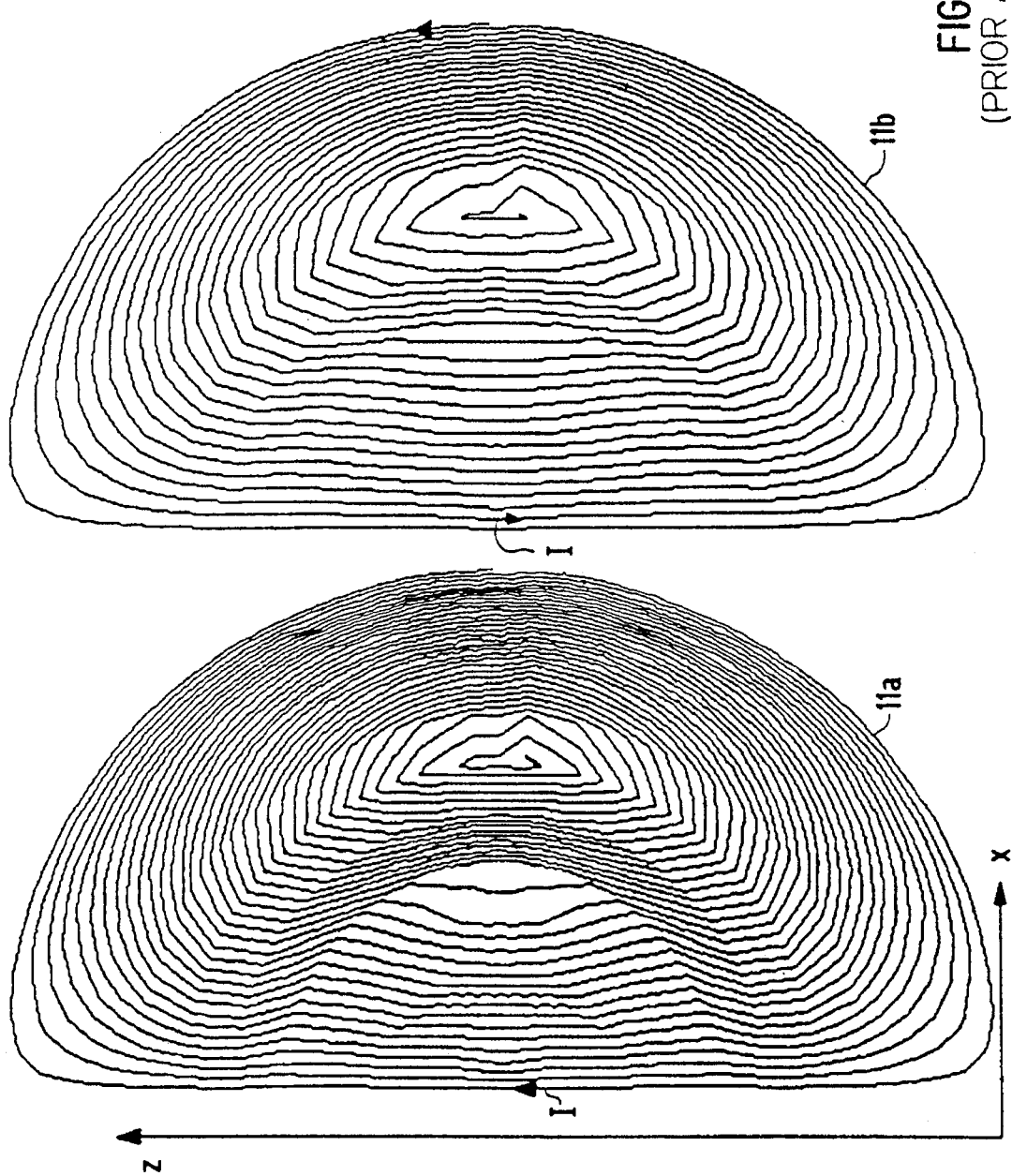
Figure 6:
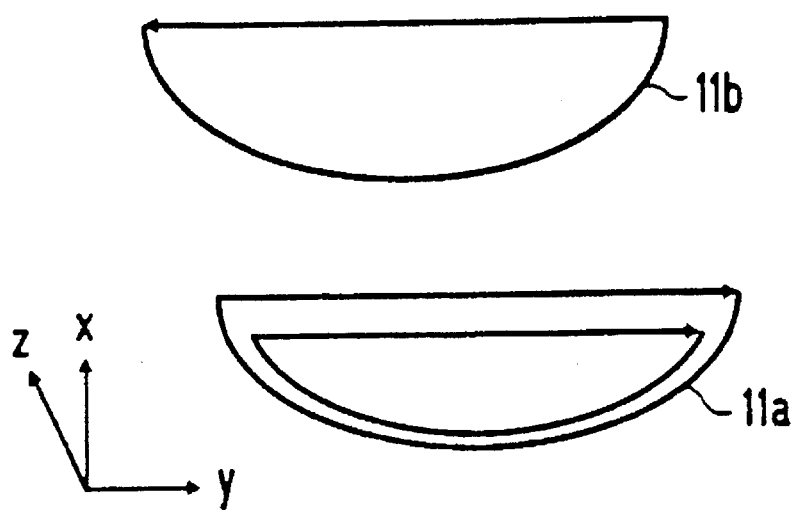
FIGS. 6 and 7 are schematic illustrations sketch for explaining the basic idea of the invention.
Figure 7:
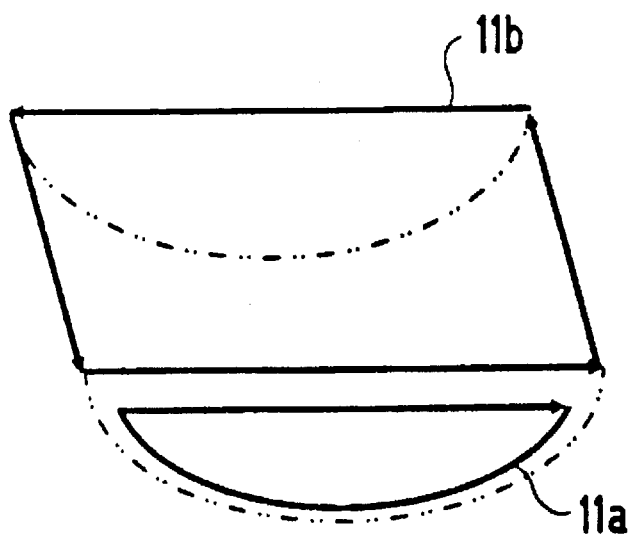

The basic idea of the present invention shall first be set forth with reference to FIGS. 6 and 7. FIG. 6 schematically shows one-half of the primary coil 11a and secondary coil 11b of the upper sub-coil as it would be present in a conventional arrangement. As is known, each primary coil and the secondary coil associated therewith are respectively oppositely traversed by current. An arcuate return conductor of the primary coil 11a in the illustrated case can be eliminated because this is not conducted over the externally lying arc but is directly connected to a returning shield element of the secondary coil 11b, as shown in FIG. 7. The perception, which is shown with reference to FIGS. 6 and 7, can be put to use so turns can be eliminated and the current density can be reduced in an actively shielded, transversal gradient coil for pole plate magnets in that the winding curve changes between the respective surface of the primary and secondary coils.

Of course, it must be taken into consideration that such a subsequent manipulation degrades the quality of the target field (gradient field) if further measures are not undertaken, when the original design of FIG. 6 is optimized in view of the target field.

It is substantially more beneficial to allow the change from one coil level or plane to the other (i.e., between the planes or levels of the primary and of the secondary coils 11a and 11b) as an additional degree of freedom in the actual coil optimization.

Figure 8:
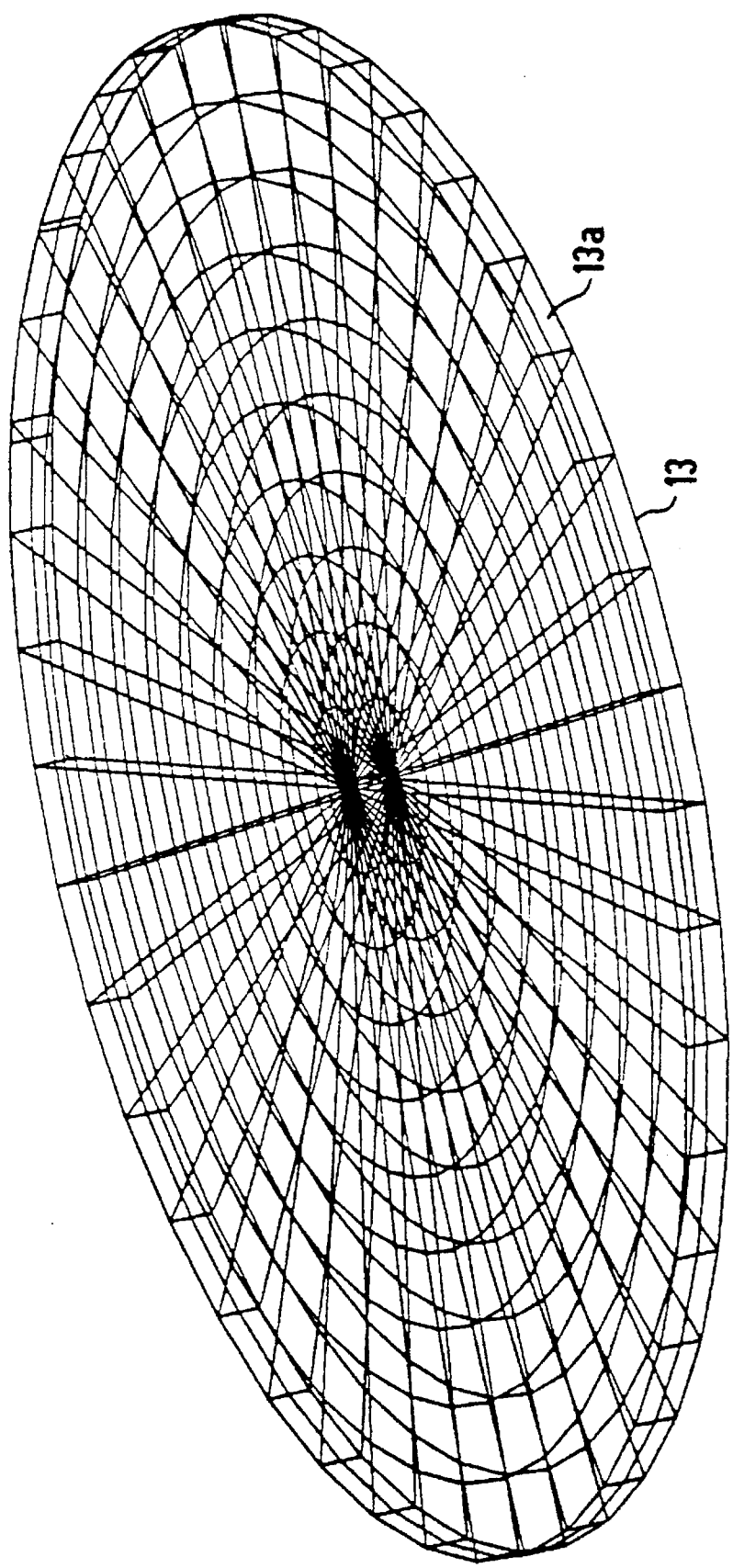
FIG. 8 shows a cylinder having a grid mesh network for calculating the winding design, of the coil of the invention.

As a simple example, FIG. 8 shows a circular plate (cylinder) 13 as a carrier for the primary and secondary coil of a sub-coil of a transversal gradient coil. The winding curve should be defined such that the conductor proceeds on the overlaps surfaces (major faces) of this plate 13 and can change from one major face surface to the other via the side surface 13a.

A generalized version of the method disclosed by U.S. Pat. No. 5,309,107 can be used for calculating the winding design, the teachings thereof being incorporated herein by reference. The following steps are implemented for this purpose:

First Step:

First, as shown in FIG. 8, a mesh network is defined on the surface of the coil carrier. The mesh network defined in this way, however, is not composed only of rectangular meshes of identical shape; trapezoidal meshes, for example, also occur on the cylinder overlapping surfaces. The m meshes obtained in this way are consecutively numbered for the purpose of mathematical ordering (1, 2 ... m).

Second Step:

A plurality of n points $P_i$ is selected in the volume of interest, whereby (i=1, ..., n), n>m apply. Let the desired target field $Z_i$ be defined in these points $P_i$.

Third Step:

Let a unit current flow successively in each of the m meshes. The field $b_{ij}$ generated by this unit current in each of the n points is calculated for each mesh. The field $b_{ij}$ is thus the field contribution of a unit current in the $j^{th}$ mesh at the location of the $i^{th}$ point. The following definitions form the basis: $\underline{\underline{b}}=(b_{ij})$ is the total matrix of all mesh elements.

$\underline{l}'=(l_1, l_2, ... l_m)$ is a vector with mesh currents, i.e. $I_k$ is the current that flows in the $k^{th}$ mesh. Further, $\underline{B}'=(B_1, B_2, ... B_n)$ with $B_k=\Sigma b_{kj} \cdot l_j$ is the vector of all field contributions in the n points. Then valid is:

$$\underline{B}=\underline{\underline{b}} \cdot \underline{l}$$

Fourth Step:

A solution vector I is defined such with a suitable fit algorithm (for example, "least mean squares") that the sum of the quadratic deviations from the target field becomes minimum. This occurs, for example, by left multiplication of the above relationship by the term $(\underline{\underline{b}}' \cdot \underline{\underline{b}})^{-1} \cdot \underline{\underline{b}}'$. Thus obtained is:

$$\underline{l}=(\underline{\underline{b}}' \cdot \underline{\underline{b}})^{-1} \cdot \underline{\underline{b}}' \cdot \underline{B}$$

Figure 9:
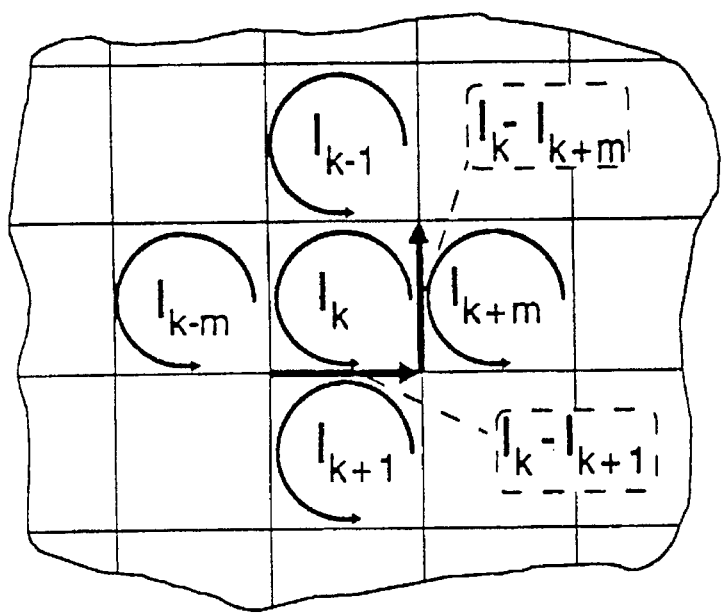
FIG. 9 is a schematic illustration of the mesh currents for calculating the winding design, of the coil of the invention.

Fifth Step:

Since each mesh branch except for the edge meshes belongs to two neighboring meshes, the resultant current for each such branch must be defined by superimposing the two mesh currents, as shown in FIG. 9. A current of $I_k-I_{k+m}$ thus derives, for example, for the mesh branch lying between the meshes k and k+m. A mesh current of $I_k-I_k+1$ derives for the mesh branch lying between the meshes k and k+1.

One thus obtains a global current distribution on the generated surface that generates the desired target field and satisfies the continuity equation. The latter is valid since each mesh is self-contained. Adherence to this condition is important since only in this way is a simulation of the three-dimensional current distribution by a closed circuit position.

Sixth Step:

The given current distribution is simulated with discrete conductors in which a constant predetermined current flows. Various solutions are known for this. For example, a defined area can first be assigned to every mesh branch (mesh width×mesh length) wherein the calculated current should flow. A distribution of current density is subsequently calculated from the global current distribution in the surface and, after a further division by the predetermined current, a winding density distribution is calculated in the given generated surface. The spatial curve of the respective conductors can be defined therefrom by integration along suitable integration paths (for example, projection of a bundle of straight lines through the stagnation point of the winding density distribution onto the generated surface). To this end, the winding density function is integrated along the path until the value of the integral becomes a whole number. The position of the conductor is defined such within the integral boundaries defined in this way that portions of the winding that are of equal size come to lie at both sides.

U.S. Pat. No. 5,309,107 is referenced again with respect to further details regarding the method of defining a winding design on the basis of a mesh network.

Given the method presented here, the emphasis of the optimization goal at hand is the minimization of the dissipated losses. This auxiliary demand runs contrary to a certain extent to the required field course in the useful volume. This can be demonstrated by considering that the minimization of the dissipative losses could be satisfied in the simplest case by no current flowing at all, but of course, no useful field would be present.

Such competing objectives are generally placed in relationship to one another by means of weighting factors in an optimization task. The function to be minimized could then, for example, by defined as follows:

Each side of a mesh (referred to as a branch) can have a relative resistance $R_i(i=1, ..., v)$ allocated to it which is proportional to the length $L_i$ of the branch and inversely proportional to the width $B_i$ thereof:

$$R_i=L_i/B_i$$

The dissipative contribution of this mesh branch to the overall thermal load is therefore proportional to $R_i J_i^2$, whereby $J_i=(I_k-I_m)$ is the current that flows through the $i^{th}$ branch that is shared by the $k^{th}$ and $m^{th}$ mesh.

If the above-described weighting factor is referenced w, the optimization goal is:

$$\text{minimize } Q = \sum_{i=1}^{v} \left[ \left( \sum_{j=1}^{m} b_{ij} \cdot l_j \right) - Z_i \right]^2 + w \cdot \sum_{i=1}^{v} R_i J_i^2$$

The boundary condition of optimally low dissipative losses can, moreover, also be combined with other physical requirements such as, for example, minimization of the coil energy. All self-inductances and coupling inductances of the mesh network are calculated for this purpose. When the coupling inductance of the $k^{th}$ mesh with the $l^{th}$ mesh is referenced $L_{ki}$ and the self-inductance of the $k^{th}$ mesh is referenced $L_{kk}$, then the coil energy W is obtained from:

$$W = \frac{1}{2} \cdot \sum_k L_{kk} \cdot I_k^2 + \sum_{k<l} L_{kl} \cdot I_k \cdot I_l$$

Finally, the function $Q_w$ to be minimized is correspondingly expanded:

$$Q_w = Q + \omega \cdot W$$

wherein ω is a further weighting factor that places the minimization of the coil energy in relationship to the aforementioned demands.

A gradient coil optimized according to the disclosed method has a short rise time given simultaneously minimized, dissipative losses in addition to the desired field quality. The maximum current densities become noticeably lower than in the case of conventional coil designs for actively shielded gradient coils. A practical solution for planar, actively shielded gradient coils is thus possible.

Figure 10:
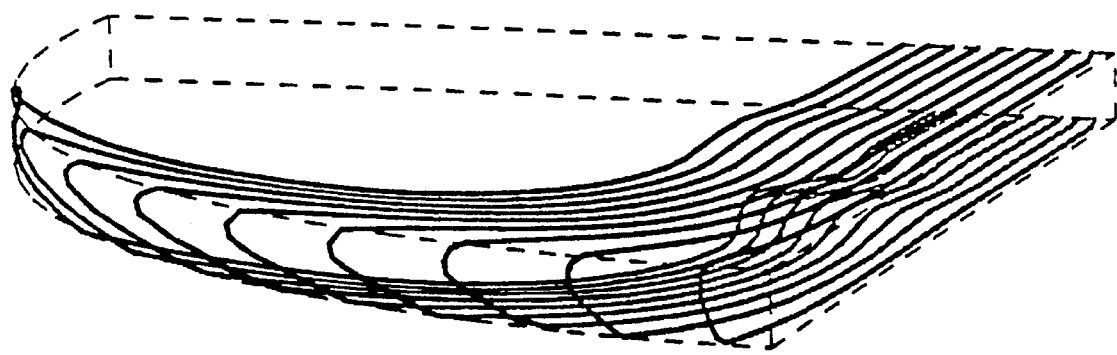
FIG. 10 shows a part of the winding curve of an inventive gradient coil.

FIG. 10 shows a perspective view of the winding curve of a coil design according to the above-described method, whereby only the inner turns are shown for clarity. One can clearly see that the windings change over the coil edge between the surface of the primary and secondary coil.

Figure 11:
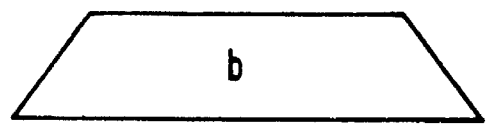
FIGS. 11 and 12 show respective embodiments of inventive gradient coils in a side view.
Figure 12:
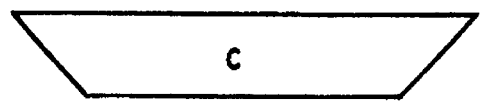
Figure 13:
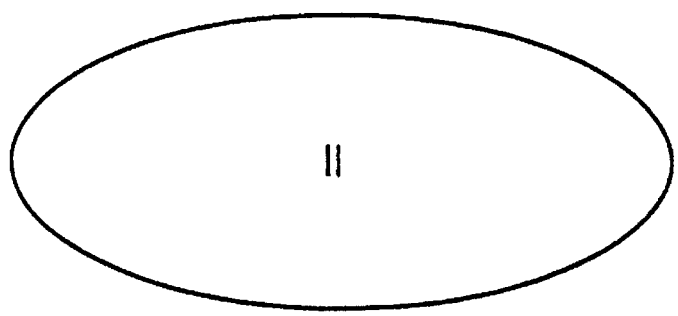
FIGS. 13 and 14 show respective embodiments of gradient coils in a plan view.
Figure 14:
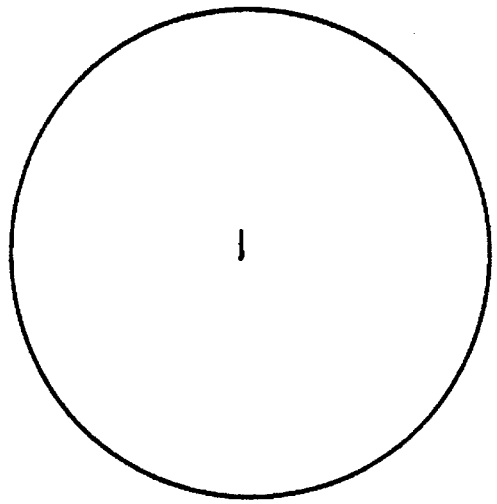

The disclosed coil design can be applied not only to the cylindrical structure described herein but, for example, also to frustrums that-as shown in cross section in FIGS. 11 or 12—can taper either away from or toward the examination space. The overlapping surfaces of the coil carrier need not be circular—as shown in FIG. 14—but, for example, can be elliptical as well corresponding to FIG. 13.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance imaging apparatus comprising:

two pole plates disposed opposite each other and defining an examination volume therebetween;

first and second planar gradient coils;

each gradient coil being composed of first and second sub-coils respectively associated with said pole plates, and each sub-coil being composed of a primary coil and a secondary coil;

the primary coil and the secondary coil of each sub-coil being respectively disposed on opposed surfaces of a frustrum and said primary coil and said secondary coil being connected by a plurality of windings extending in a winding path over a surface of said frustrum between said opposing surfaces with said winding path changing multiply over said surface between said opposing surfaces; and means for supplying said primary coil and said secondary coil of each sub-coil with respective currents for causing each primary coil and secondary coil of a sub-coil to generate respective magnetic fields toward said pole plates which are substantially cancelled for actively shielding the respective gradient coils.

2. A magnetic resonance imaging apparatus as claimed in claim 1 wherein said primary coil and said secondary coil and said windings are disposed on surfaces of a frustrum of a cylinder.

3. A magnetic resonance imaging apparatus as claimed in claim 2 wherein said primary coil and said secondary coil and said windings are disposed on surfaces of a frustrum of an elliptical cylinder.

4. A magnetic resonance imaging apparatus as claimed in claim 2 wherein said primary coil and said secondary coil and said windings are disposed on surfaces of a frustrum of a circular cylinder.

5. A method for constructing a gradient coil formed by a conductor for producing a target field distribution with a prescribed current in a magnetic resonance system, said method comprising the steps of:

composing a gradient coil of first and second sub-coils;

composing each sub-coil of a primary coil and a secondary coil;

orienting the primary coil and the secondary coil composing a gradient coil on opposing surfaces of a frustrum and connecting said primary coil and said secondary coil with multiple windings in a winding path extending over a surface of said frustrum between said opposing surfaces with said winding path changing multiply over said surface between said opposing surfaces;

subdividing all surfaces of said frustrum by means of a grid mesh network placed over the frustrum, said network having grid openings and mesh branches;

occupying each grid opening in said network with a modeled elementary coil in the form of a closed turn, each elementary coil generating a respective magnetic field;

calculating the magnetic field generated by each of said elementary coils;

defining a number of ampere-turns for each elementary coil using a fit algorithm based on said target field distribution;

calculating a number of ampere-turns for each mesh branch by superimposing the ampere-turns for all of the elementary coils adjacent each mesh branch and thereby obtaining an ampere-turn density distribution over said network;

successively integrating said ampere-turn density distribution over whole-numbers of turns along an integration path based on said prescribed current to obtain a plurality of points on said frustrum; and positioning said conductor on said frustrum in a configuration conforming to said points.

6. A method as claimed in claim 5 comprising the additional step of minimizing an overall ohmic loss of said gradient coil.

7. A method as claimed in claim 6 comprising the additional step of minimizing an overall coil energy of said gradient coil in combination with minimizing said ohmic loss.

* * * * *